(12) United States Patent
Vidal

(10) Patent No.: US 6,262,476 B1
(45) Date of Patent: Jul. 17, 2001

(54) COMPOSITE MEMBER COMPOSED OF AT LEAST TWO INTEGRATED CIRCUITS AND METHOD FOR THE MANUFACTURE OF A COMPOSITE MEMBER COMPOSED OF AT LEAST TWO INTEGRATED CIRCUITS

(75) Inventor: Ulrich Vidal, Landshut (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/360,973

(22) Filed: Jul. 27, 1999

(30) Foreign Application Priority Data

Jul. 27, 1998 (DE) .............................................. 198 33 713

(51) Int. Cl.$^7$ ................................................... H01L 23/02
(52) U.S. Cl. ............................................ 257/686; 257/727
(58) Field of Search ..................................... 257/686, 685, 257/723, 724, 727

(56) References Cited

U.S. PATENT DOCUMENTS

| | | | |
|---|---|---|---|
| 4,696,525 | * 9/1987 | Coller et al. | 439/69 |
| 5,138,438 | * 8/1992 | Masayuki et al. | 357/75 |
| 5,323,060 | * 6/1994 | Fogal et al. | 257/777 |
| 5,479,318 | * 12/1995 | Burns | 361/735 |
| 5,508,563 | 4/1996 | Tazawa et al. | 257/773 |
| 5,530,292 | 6/1996 | Waki et al. | 257/724 |
| 5,760,471 | 6/1998 | Fujisawa et al. | 257/692 |

* cited by examiner

Primary Examiner—Timothy P. Callahan
Assistant Examiner—Hai L. Nguyen
(74) Attorney, Agent, or Firm—Schiff Hardin & Waite

(57) ABSTRACT

A composite member has at least two integrated electronic circuits (10, 210). Principal surfaces of the integrated electronic circuits (10, 210) are aligned substantially parallel to one another. The integrated electronic circuits (10, 210) have terminal lines (20, 20', 30, 220', 230) in the region of at least one of their boundary surfaces. The composite member is configured such that at least some of the terminal lines (20, 20', 30) of one of the integrated electronic circuits (10) are directly connected to at least one terminal line (220', 230) of another integrated electronic circuit (210). The method is for the manufacture of the composite member.

1 Claim, 2 Drawing Sheets

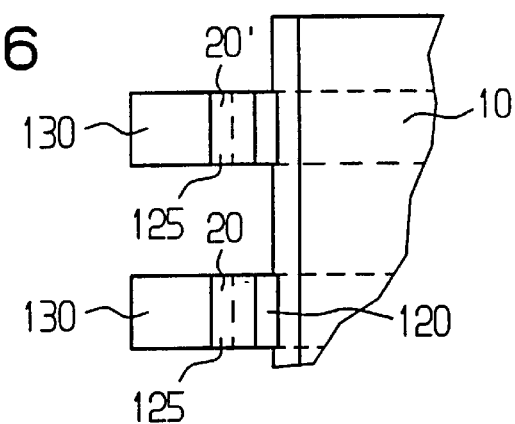
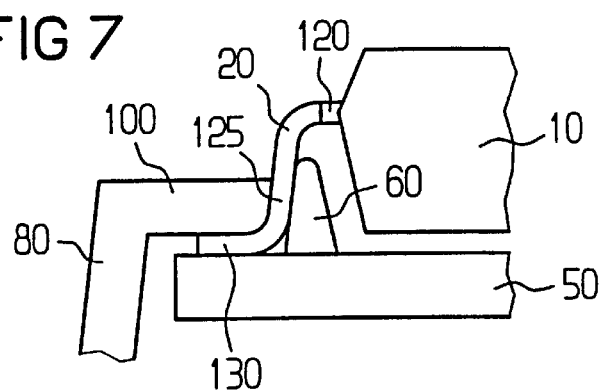
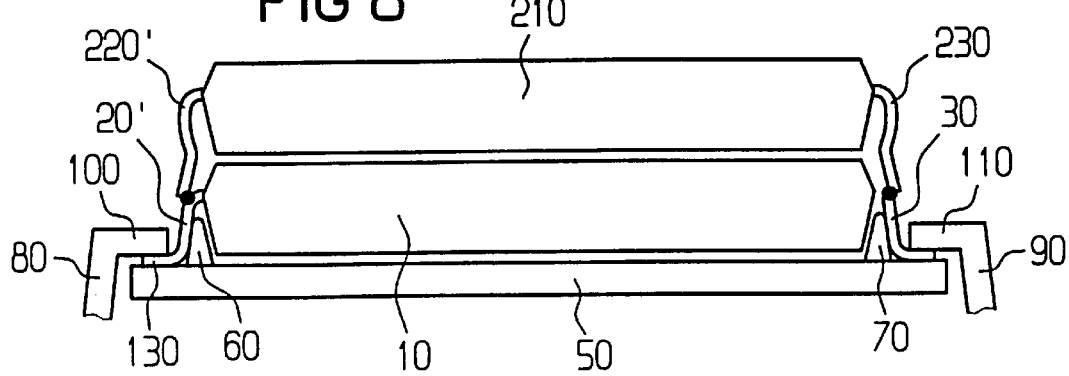

US 6,262,476 B1

COMPOSITE MEMBER COMPOSED OF AT LEAST TWO INTEGRATED CIRCUITS AND METHOD FOR THE MANUFACTURE OF A COMPOSITE MEMBER COMPOSED OF AT LEAST TWO INTEGRATED CIRCUITS

BACKGROUND OF THE INVENTION

The present invention is directed to a composite member composed of at least two integrated electronic circuits, whereby principal services of the integrated electronic circuits are aligned essentially parallel to one another, and whereby the integrated electronic circuits comprise terminal lines in the region of at least one of their boundary surfaces.

The invention is also directed to a method for the manufacture of a composite member having at least two integrated electronic circuits, whereby principal surfaces of the integrated electronic circuits are aligned essentially parallel to one another, and whereby the integrated electronic circuits are provided with terminal lines in the region of at least one of their boundary surfaces.

A composite member of the type manufactured by Toshiba comprises two integrated circuits whose terminal lines are connected to one another by an additional contact element such as, for example, an auxiliary frame or a solder lug. The manufacture of these composite members is comparatively complicated.

SUMMARY OF THE INVENTION

The invention is based on the object of creating a composite member of the species that is structurally simplified. Moreover, a method of the species should be implemented with high dependability and in short clock times.

This object is inventively achieved in that a composite member of the species is fashioned such that at least a part of the terminal lines of one of the integrated electronic circuits is directly connected to at least one terminal line of another integrated electronic circuit.

Inventively, further, a method of the species for the manufacture of a composite member is implemented such that at least a part of the terminal lines of one of the integrated electronic circuits is directly connected to at least one terminal line of another integrated electronic circuit.

The invention thus provides that the composite member composed of at least two integrated electronic circuits, particularly of integrated electronic circuits that contain memory cell arrangements, be created in that terminal wires of the individual integrated electronic circuits are directly connected to one another, i.e. without interposition of terminal elements.

Such a composite member is preferably implemented as what is referred to as a stacked package. The individual integrated electronic circuits are thereby located immediately on one another, so that their principal surfaces touch. In this way, it is possible to arrange an optimally high plurality of integrated electronic circuits on an optimally small space.

Especially advantageously, the method is implemented such that at least a part of the connecting lines that are connected to other connecting lines are bent before connecting.

In order to achieve an especially durable, direct connection, it is expedient that the terminal lines are connected to one another by welding.

Especially high clock times as well as an especially high dependability of the process can be achieved in that the energy required for the welding is at least partially supplied by laser radiation.

An unambiguous addressing of function elements, particularly memory cells, can be achieved in that, before two terminal lines are connected to one another, one of the terminal lines is separated from an integrated electronic circuit with which it was in contact in a previous processing step.

It is thereby especially advantageous that the energy required for the parking of the terminal line from the integrated electronic circuit is at least partially supplied by laser radiation.

By using laser radiation both for the welding as well as for the parting, these two processing steps can be implemented in a single processing station, potentially even simultaneously.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 6 depicts portions from a cross-section through an edge region of an integrated electronic circuit;

FIG. 7 is a cross-section through the edge region of the integrated electronic circuit shown in FIG. 6 in a plane proceeding perpendicular to the principal plane of the integrated electronic circuit;

FIG. 8 depicts the retaining mechanism shown in FIG. 5 with two integrated electronic circuits arranged above one another and held by it.

DESCRIPTION OF THE PREFERRED EMBODIMENTS

Figure 1:
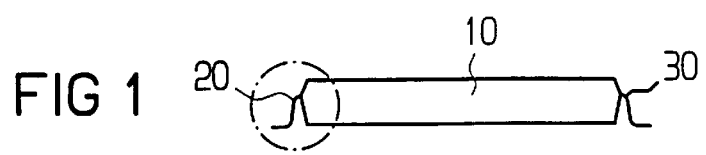
FIG. 1 is a cross-section through an integrated electronic circuit with terminal lines.

FIG. 1 shows an integrated electronic circuit 10 that comprises terminal lines 20, 30 in the region of lateral surfaces. In order to enhance the clarity of the illustration, how the terminal lines 20, 30 penetrate into the integrated electronic circuit 10 is not shown.

Figure 2:
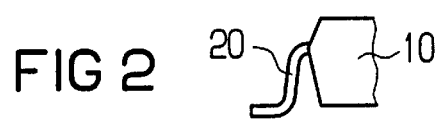
FIG. 2 is an excerpt from FIG. 1 in the region of a terminal line.

FIGS. 1 and 2 show the shape that the terminal lines 20, 30 exhibit after a first bending. The terminal lines 20 and 30 thereby exhibit a S-shape.

Figure 3:
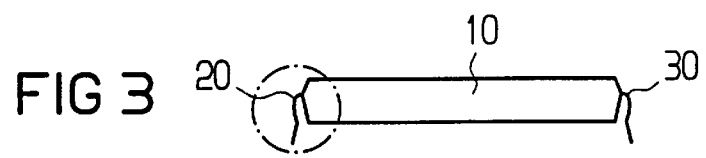
FIG. 3 depicts the integrated electronic circuit shown in FIG. 1 after a bending of the terminal line.
Figure 4:
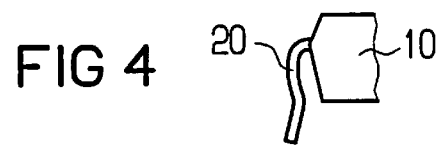
FIG. 4 is an excerpt from FIG. 3 in the region of the terminal line.

A partial bent-back of the terminal lines 20 and 30 subsequently ensues, as shown in FIGS. 3 and 4.

Figure 5:
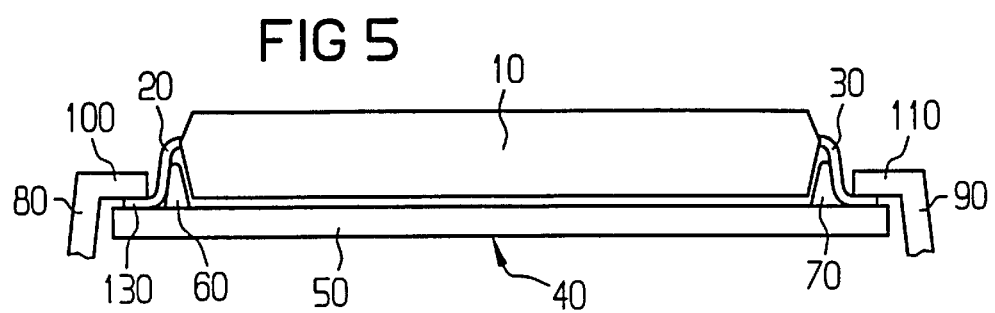
FIG. 5 depicts a retaining mechanism composed of a base and two retaining clamps with an integrated electronic circuit held by it.

After at least one bending procedure of the terminal lines 20, 30, the integrated electronic circuit 10 is placed onto a retaining device 40 as shown by way of example in FIG. 5. The retainer device 40 comprises a base 50 and projections 60, 70. The integrated electronic circuit 10 is located between the projections 60, 70, whereby the terminal leads 20, 30 project beyond the projections 60, 70. The projections 60, 70 also serve for fixing the integrated electronic circuit 10. Subsequently, holding clamps 80, 90 are applied such that the terminal lines 20, 30 are respectively fixed between the projection 60 or, respectively 70, and a holding clamp 80 or, respectively, 90. In the preferred case that the terminal lines 20, 30 comprise a S-shape it is advantageous that the holding clamps 80, 90 fix the terminal lines 20, 30 both relative to the projections 60, 70 as well as relative to the base 50. To this end, the holding clamps 80 or, respectively, 90 comprise projections 100, 110. A lower arc 130 of the S is fixed by the projection 100 of the holding clamp 80.

FIGS. 6 and 7 show how a selected terminal line 20 is parted.

FIG. 6 shows portions of an edge region of the integrated electronic circuit 10 in a plane proceeding parallel to a principal surface of the integrated electronic circuit 10. It is thereby shown that individual terminal lines 20 are parted, whereas other terminal lines 20' are not parted. The parting of the terminal lines 20 preferably ensues in their upper region. When the terminal lines exhibit a S-shape, as in the illustrated case, their parting preferably ensues in the region of the upper arc of the S. The parking preferably ensues at a distance from a principal lake region 125 of the S.

A parting of terminal lines 20 preferably ensues in regions that serve for an addressing of function elements, particularly memory cells, in upper integrated electronic circuits. This parting ensues in that the terminal lines are parted at least in a region 120. It is especially advantageous that this parting ensues in that the region 120 is removed. Such a removal preferably ensues with a brief-duration, targeted application of energy. It is especially advantageous that laser radiation serves for the energy application. As a result thereof, it is possible to select the energy application locally and in terms of time such that only the region 120 is removed, this particularly ensuing by targeted evaporation. A thermal stress of the integrated electronic circuit 10 is avoided due to the limitation of the energy application in terms of time and location.

FIG. 7 shows an arrangement suitable for the implementation of the parking procedure in a different cross-sectional plane. It can be seen that the terminal line 20 is clamped between the projection 60 of the base 50 and the projection 100 of the holding clamp 80. A terminal line 20 is fixed in the region of the lower leg of the S between the lower edge region of the projection 100 and the base 50 and is fixed in the region of the principal leg 125 between a lateral surface of the projection 100 and the projection 60 of the base 50.

As already presented with reference to FIG. 6, a parting of the terminal line 20 particularly ensues in the region 120.

It can also be seen in the illustration in FIG. 7 that the terminal line 20 penetrates into the integrated electronic circuit 10 as interconnect. It is especially advantageous that the terminal line 20 is a part or an extension of an interconnect situated in the integrated electronic circuit 10.

Preferably, only some of the terminal lines 20, 30 are parted. When, for example, two integrated electronic circuits 10, 210 are arranged on top of one another, each second terminal line 20 or, respectively, 30 is parted. The respectively neighboring terminal lines, however, are not parted.

The plurality of terminal lines to be parted is preferably selected dependent on the plurality of integrated electronic circuits to be arranged above one another. Whereas every second terminal line is not parted given two integrated electronic circuits arranged above one another, only every fourth terminal line of the lower integrated electronic circuit 10 is not parted given, for example, four integrated electronic circuits arranged above one another.

The further implementation of the method when two integrated electronic circuits 10, 210 are arranged above one another is presented below with reference to FIG. 8.

The terminals 20', 30 are thereby fixed in the way that was previously presented.

Terminal lines 220' or, respectively, 230 of the integrated electronic circuit 210 are connected to terminal lines 20' or, respectively, 30 of the integrated electronic circuit 10 located below them. Although the terminal line 30 originally belonged to the lower integrated electronic circuit 10, due to a parting in the region of the integrated electronic circuit 10 and due to a connection to the terminal line 230, it has become a terminal line of the upper integrated electronic circuit 210.

The terminal line 30 is thus preferably connected to the terminal 230 such that a uniform lead arises. To this end, it is expedient that the connection of the two terminal lines 30 and 230 ensued with a targeted application of laser radiation.

The illustrated apparatus for the manufacture of a composite member is a preferred example of a suitable apparatus. Of course, it is also possible to manufacture the composite member with other suitable devices. Such a manufacture, however, can be implemented especially fast and reliably with the assistance of the illustrated device.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A composite member having at least two integrated electronic circuits, comprising:

each of the integrated electronic circuits having a principal surface;

principal surfaces of the integrated electronic circuits being aligned substantially parallel to one another;

the integrated electronic circuits having terminal lines in a region of at least one boundary surface of boundary surfaces of the integrated electronic circuits, the terminal lines having an S-shape;

at least some of the terminal lines of one of the integrated electronic circuits being directly connected to at least one terminal line of another integrated electronic circuit of the integrated electronic circuits producing direct connections, the direct connections being welded terminal lines; and separated terminal lines that have been parted in a region of an upper arc of the S-shape of the terminal line with laser radiation.

\* \* \* \* \*